(12) United States Patent
Ito

(10) Patent No.: US 7,969,206 B2
(45) Date of Patent: Jun. 28, 2011

(54) SEMICONDUCTOR ELEMENT DRIVE CIRCUIT

(75) Inventor: Kenji Ito, Chiryu (JP)

(73) Assignee: DENSO CORPORATION, Kariya (JP)

( * ) Notice: Subject to any disclaimer, the term of this patent is extended or adjusted under 35 U.S.C. 154(b) by 638 days.

(21) Appl. No.: 12/153,461

(22) Filed: May 20, 2008

(65) Prior Publication Data

US 2008/0290853 A1 Nov. 27, 2008

(30) Foreign Application Priority Data

May 21, 2007 (JP) .................................. 2007-134074

(51) Int. Cl.
*H03K 3/00* (2006.01)
(52) U.S. Cl. ........................................ 327/108; 327/112
(58) Field of Classification Search .................. 327/108, 327/109, 112
See application file for complete search history.

(56) References Cited

U.S. PATENT DOCUMENTS

| 5,552,746 A * | 9/1996 | Danstrom | 327/427 |
| 7,453,308 B2 * | 11/2008 | Tihanyi | 327/309 |
| 7,579,880 B2 * | 8/2009 | Ueda | 327/108 |

* cited by examiner

*Primary Examiner* — Hai L Nguyen
(74) *Attorney, Agent, or Firm* — Posz Law Group, PLC

(57) ABSTRACT

A drive circuit for driving a semiconductor element according to an input signal includes an output stage, a clamp circuit, a comparator, and a clamp control circuit. The output stage includes a series circuit of two transistors. A node between the transistors is coupled to a control terminal of the semiconductor element. One of the transistors is turned on when the input signal indicates that the semiconductor element is driven. The clamp circuit clamps a potential of the control terminal to a level enough to drive the semiconductor element when the one of the transistors is turned on. The comparator compares a power supply voltage of the drive circuit with a threshold voltage. The clamp control circuit disables the clamp circuit when the power supply voltage is less than the threshold voltage.

2 Claims, 4 Drawing Sheets

US 7,969,206 B2

SEMICONDUCTOR ELEMENT DRIVE CIRCUIT

CROSS REFERENCE TO RELATED APPLICATION

This application is based on and incorporates herein by reference Japanese Patent Application No. 2007-134074 filed on May 21, 2007.

FIELD OF THE INVENTION

The present invention relates to a drive circuit for outputting a drive signal to a voltage-driven semiconductor element according to an input signal.

BACKGROUND OF THE INVENTION

FIG. 6 shows a conventional drive circuit disclosed in U.S. Pat. No. 5,552,746 corresponding to JP-A-H8-293774. The drive circuit receives a control signal and outputs a drive signal to a voltage-driven semiconductor element (i.e., transistor) 144 according to the control signal. The drive circuit includes an active voltage clamp circuit that protects the gate of the transistor 144 from an excessive electrical stress. The clamp circuit includes Zener diodes 132, 134 and a current mirror constructed with transistors 136, 138. If a power supply +B is less than a threshold voltage Vth0, the active voltage clamp circuit is passive and does not affect the operation of the drive circuit. The threshold voltage Vth0 is given as follows:

$Vth0 = Vth1$ of the diode 132 + $Vth2$ of the diode 134 + $VBE$ of the transistor 138

Conversely, the active voltage clamp circuit becomes active when the power supply +B is at or above the threshold voltage Vth0 by conducting an electric current through the diodes 132, 134 and the transistor 138. The current flowing through the transistor 138 is mirrored through the transistor 136 which is connected to the gate of the transistor 125. If the power supply +B is at a voltage larger than the threshold voltages Vth1, Vth2 of the diodes 132, 134, an electric current will begin to flow through the diodes 132, 134 and that current will be mirrored through the transistor 136 which would then pull the gate of transistor 125 low. Consequently, the gate potential of transistor 144 is clamped at the voltage threshold of diodes 132, 134 plus the voltage drop across transistor 138. Thus, the current flow is limited by the feedback loop established through the diodes 132, 134 and the current mirror constructed with the transistors 136, 138.

In the above-described conventional drive circuit, the transistor 140 at the output stage is connected in an emitter follower configuration so that the gate potential of the transistor 144 is clamped by the base-emitter voltage VBE. However, the gate potential cannot exceed a level that is obtained by subtracting the base-emitter voltage VBE from the power supply +B. Therefore, if the power supply +B decreases, a bias voltage enough to adequately drive the transistor 144 cannot be produced.

SUMMARY OF THE INVENTION

In view of the above-described problem, it is an object of the present invention to provide a semiconductor element drive circuit that has a voltage clamp function and can adequately bias a semiconductor element even if a power supply voltage decreases.

A drive circuit for driving a voltage-driven semiconductor element according to an input signal includes an output stage, a clamp circuit, a comparison circuit, and a clamp control circuit. The output stage includes a series circuit of two output transistors. A node between the two output transistors is coupled to a control terminal of the semiconductor element. One of the two output transistors is turned on when an input signal indicates that the semiconductor element is driven. The clamp circuit is configured to clamp a potential of the control terminal of the semiconductor element to a predetermined level enough to drive the semiconductor element when the one of two output transistors is turned on. The comparison circuit is configured to compare a power supply voltage of the drive circuit with a threshold voltage. The clamp control circuit is configured to disable the clamp circuit when the comparison circuit determines that the power supply voltage is less than the threshold voltage.

BRIEF DESCRIPTION OF THE DRAWINGS

The above and other objectives, features and advantages of the present invention will become more apparent from the following detailed description made with check to the accompanying drawings. In the drawings.

DETAILED DESCRIPTION OF THE PREFERRED EMBODIMENTS

First Embodiment

Figure 1:
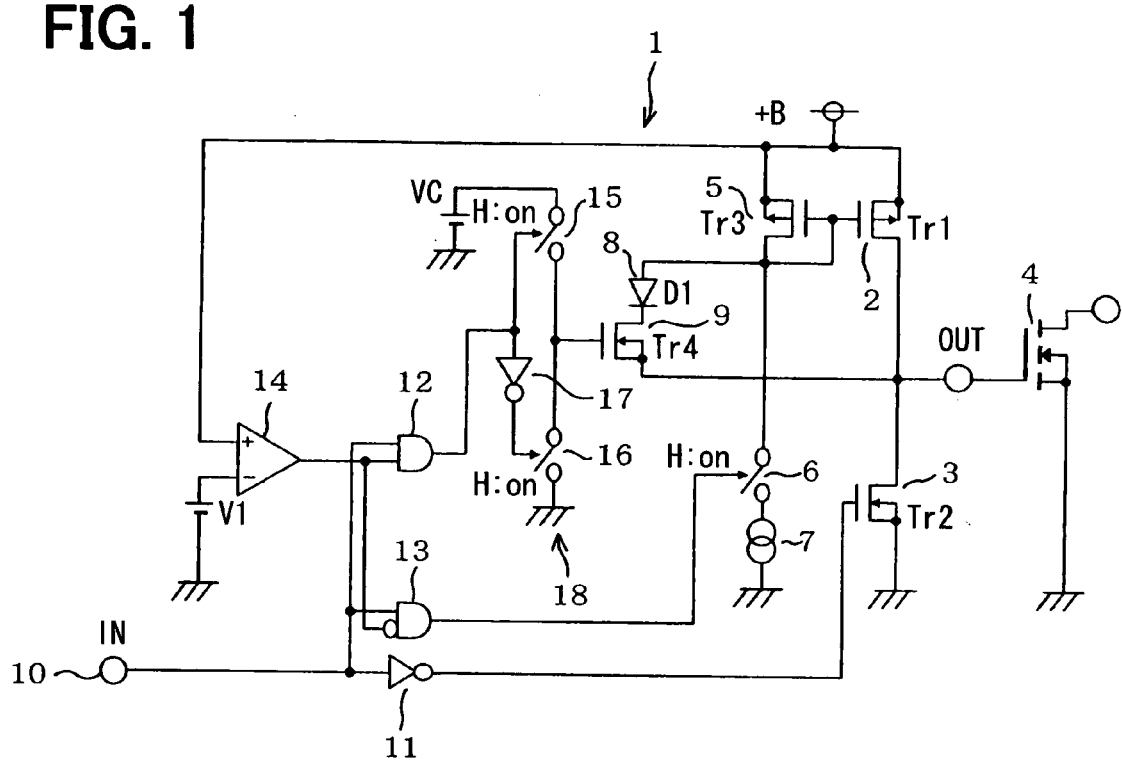
FIG. 1 is a diagram illustrating a semiconductor element drive circuit according to a first embodiment of the present invention.

A semiconductor element drive circuit 1 according to a first embodiment of the present invention will be described. Referring now to FIG. 1, an output stage of the drive circuit 1 includes a series circuit coupled between a power supply +B and ground. The series circuit at the output stage includes a P-channel metal oxide semiconductor field-effect transistor (MOSFET) 2 coupled to the power supply +B and an N-channel MOSFET 3 coupled between the MOSFET 2 and the ground. A node between the MOSFETs 2, 3 is coupled to the gate (i.e., control terminal) of an N-channel power MOSFET 4 (i.e., semiconductor element). Specifically, the drains of the MOSFETs 2, 3 are coupled together and coupled to the gate of the MOSFET 4. The source of the MOSFET 4 is coupled to the ground, and the drain of the MOSFET 4 is coupled to an electrical load (not shown) such as an electrical motor.

The MOSFET 2 and a P-channel MOSFET 5 (i.e., mirror transistor) form a current mirror. The gates of the MOSFETs 2, 5 are coupled together and coupled to the drain of the MOSFET 5. A series circuit of a switch circuit 6 and a constant current source 7 is coupled between the drain of the MOSFET 5 and the ground. A series circuit of a diode 8 and an N-channel MOSFET 9 (i.e., clamp transistor) are coupled between the drain of the MOSFET 5 and the gate of the MOSFET 4. The diode 8 prevents backflow of current. The switch circuit 6 is turned on upon receipt of a high level signal.

The drive circuit 1 has a signal input terminal 10 for receiving a control signal from outside the drive circuit 1. The signal input terminal 10 is coupled to the gate of the MOSFET 3 via an NOT gate (i.e., inverter) 11. Further, the signal input terminal 10 is coupled to each of first input terminals of AND gates 12, 13. A comparator 14 has a non-inverting input terminal coupled to the power supply +B and an inverting input terminal coupled to a reference voltage V1. For example, the reference voltage V1 is about four to five volts less than the power supply +B. An output of the comparator 14 is coupled to each of second input terminals of the AND gates 12, 13. As can be seen from FIG. 1, the second input terminal of the AND gate 13 is negative logic.

A series circuit of a switch circuit 15 and a reference voltage VC is coupled between the gate of the MOSFET 9 and the ground. A switch circuit 16 is coupled in parallel with the series circuit of the switch circuit 15 and the reference voltage VC. Like the switch circuit 6, each of the switch circuits 15, 16 is turned on upon receipt of a high level signal. An output of the AND gate 12 is coupled directly to the switch circuit 15 and coupled via an NOT gate 17 to the switch circuit 16. The reference voltage VC is equal to or greater than a threshold voltage Vth of the MOSFET 9. An output of the AND gate 13 is coupled directly to the switch circuit 6. The switch circuits 15, 16, the reference voltage VC, and the NOT gate 17 form a clamp control circuit 18.

Figure 2A:
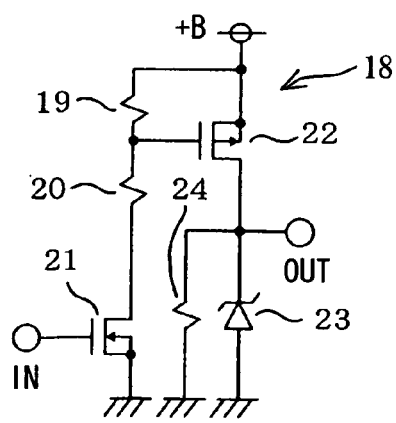
FIG. 2A is a diagram illustrating a concrete example of a clamp circuit in the drive circuit of FIG. 1.

One concrete example of the clamp control circuit 18 is illustrated in FIG. 2A. As shown in FIG. 2A, a series circuit of resistors 19, 20 and an N-channel MOSFET 21 is coupled between the power supply +B and the ground. The gate of the MOSFET 21 is configured as an input terminal for receiving the control signal. Further, a series circuit of a P-channel MOSFET 22 and a Zener diode 23 is coupled between the power supply +B and the ground. A node between the MOSFET 22 and the Zener diode 23 is configured as an output terminal coupled to the gate of the MOSFET 9. A resistor 24 is coupled in parallel with the Zener diode 23. A node between the resistors 19, 20 is coupled to the gate of the MOSFET 22.

In the case of the structure shown in FIG. 2A, when the control signal inputted to the gate of the MOSFET 21 is low, each of the MOSFETs 21, 22 is OFF. As a result, an output signal outputted to the gate of the MOSFET 9 is low (i.e., ground level). In contrast, when the control signal inputted to the gate of the MOSFET 21 is high, each of the MOSFETs 21, 22 is ON. As a result, the output signal outputted to the gate of the MOSFET 9 is high (i.e., Zener voltage VC of the Zener diode 23).

Figure 2B:
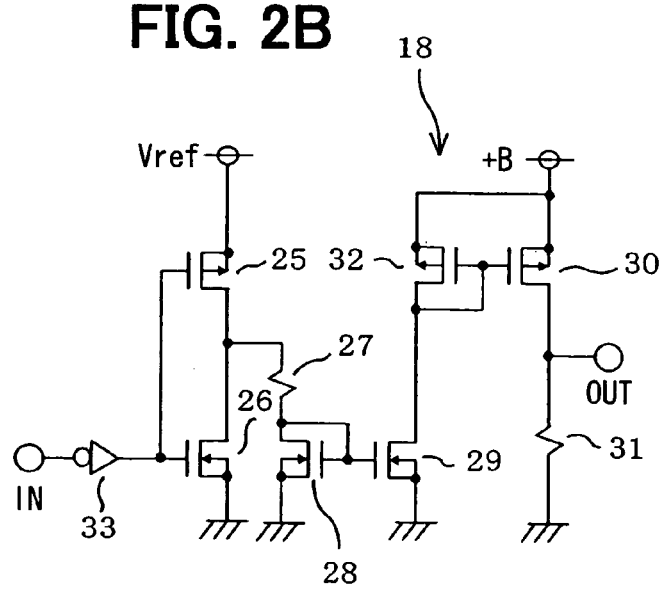
FIG. 2B is a diagram illustrating another concrete example of a clamp circuit in the drive circuit of FIG. 1.

Another concrete example of the clamp control circuit 18 is illustrated in FIG. 2B. As shown in FIG. 2B, a series circuit of a P-channel MOSFET 25 and an N-channel MOSFET 26 is coupled between a reference voltage Vref and the ground. The gates of the MOSFETs 25, 26 are coupled together and coupled via a NOT gate 33 to an input terminal for receiving the control signal. A node between the MOSFETs 25, 26 is coupled to the ground via a resistor 27 and an N-channel MOSFET 28. Specifically, the drains of the MOSFETs 25, 26 are coupled together and coupled to the ground via the resistor 27 and the MOSFET 28.

The MOSFET 28 and an N-channel MOSFET 29 form a current mirror. The gates of the MOSFETs 28, 29 are coupled together and coupled to the drain of the MOSFET 28. A series circuit of a P-channel MOSFET 30 and a resistor 31 is coupled between the power supply +B and the ground. A node between the MOSFET 30 and the resistor 31 is configured as an output terminal coupled to the gate of the MOSFET 9. The MOSFET 30 and a P-channel MOSFET 32 form a current mirror. The gates of the MOSFETs 30, 32 are coupled together and coupled to the drain of the MOSFET 32.

In the case of the structure shown in FIG. 2B, when the control signal inputted to the input terminal is high (i.e., the output of the NOT gate 33 is low), the MOSFET 25 is ON, and the MOSFET 26 is OFF. Therefore, the MOSFETs 28, 29 are ON so that the MOSFETs 30, 32 are ON. As a result, the output signal outputted to the gate of the MOSFET 9 is high (i.e., a voltage drop VC across the resistor 31). In contrast, when the control signal inputted to the input terminal is low (i.e., the output of the NOT gate 33 is high), the MOSFET 25 is OFF, and the MOSFET 26 is ON. Therefore, the MOSFETs 28, 29 are OFF so that the MOSFETs 30, 32 are OFF. As a result, the output signal outputted to the gate of the MOSFET 9 is low (i.e., ground level).

An operation of the drive circuit 1 according to the first embodiment is described with reference to FIG. 1.

(1) First Case where a Control Signal is Low

When the control signal supplied to the signal input terminal 10 from outside the drive circuit 1 is low, the MOSFET 3 is ON. Since the output signals of the AND gates 12, 13 are low, the switch circuit 6 is OFF, the switch circuit 15 is OFF, and the switch circuit 16 is ON. Therefore, the gate potential of the MOSFET 9 becomes the ground level so that the MOSFET 9 is OFF. As a result, the MOSFETs 2, 5 are OFF, and the gate potential of the MOSFET 4 becomes the ground level so that the MOSFET 4 is OFF.

(2) Second Case where a Control Signal is High, and +B≧V1

In the second case, the MOSFET 3 at the output stage is OFF, and the output signal of the comparator 14 is high. Since the output signal of the AND gate 12 is high, the switch circuit 15 is ON, and the switch circuit 16 is OFF. Therefore, the gate potential of the MOSFET 9 becomes the reference voltage VC so that the MOSFET 9 is ON. As a result, the MOSFETs 2, 5 are ON so that the MOSFET 4 is ON. In this case, a gate potential VG of the MOSFET 4 is clamped to a level obtained by subtracting the threshold voltage Vth of the MOSFET 9 from the reference voltage VC. In short, the gate potential VG of the MOSFET 4 is given as follows:

$$VG=VC-Vth$$

(3) Third Case where a Control Signal is High, and +B<V1

In the third case, since the output signal of the comparator 14 is low, the output signal of the AND gate 12 is low, and the output signal of the AND gate 13 is high. Therefore, the switch circuit 15 is OFF, and the switch circuit 16 is ON. As a result, the MOSFET 9 is OFF. Since the switch circuit 6 is ON, the MOSFETs 2, 5 are driven by the constant current source 7 and turned on. In this case, the gate potential VG of the MOSFET 4 becomes equal to the drain potential of the MOSFET 2. Thus, a voltage clamp function achieved through the MOSFET 9 is not performed. Specifically, there is no need to clamp the gate potential VG of the MOSFET 4 in the condition where the power supply +B decreases below the reference voltage V1. Therefore, when the power supply +B decreases below the reference voltage V1, the voltage clamp function is disabled to prevent a reduction in a bias voltage applied to the gate of the MOSFET 4.

As described above, according to the drive circuit 1 of the first embodiment, the clamp control circuit 18 receives the control signal from outside the drive circuit 1 and controls the MOSFET 4 according to the control signal. When the MOSFET 2 is ON, the clamp control circuit 18 clamps the gate potential VG of the MOSFET 4. If the comparator 14 determines that the power supply +B decreases below the reference voltage V1, the voltage clamp function achieved through the MOSFET 9 is disabled. Thus, the bias voltage applied to the gate of the MOSFET 4 can be maintained at a level enough to adequately drive the MOSFET 4.

Specifically, when the control signal is high, and the power supply +B decreases below the reference voltage V1, the clamp control circuit 18 disables the voltage clamp function by turning off the MOSFET 9 and by turning on the switch circuit 6. At the same time, the clamp control circuit 18 drives the MOSFET 5 using the constant current source 7. As a result, the MOSFET 2, which forms a current mirror with the MOSFET 5, is driven. In such an approach, the MOSFET 4 can be fully turned on by receiving enough bias voltage.

Second Embodiment

Figure 3:
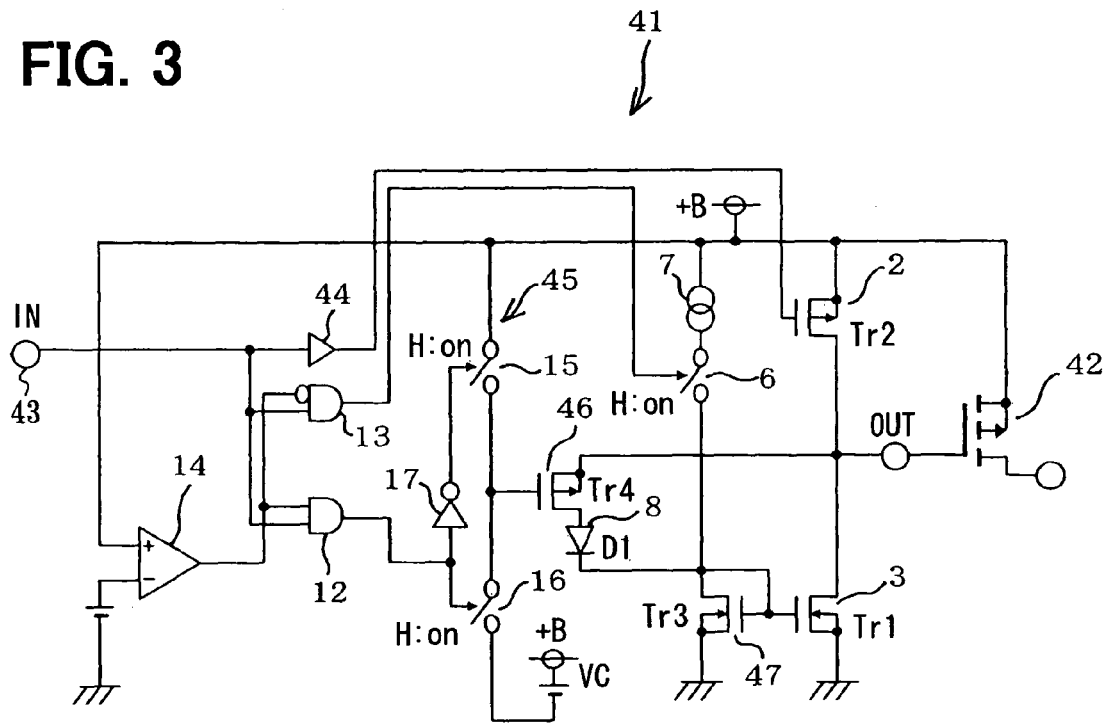
FIG. 3 is a diagram illustrating a semiconductor element drive circuit according to a second embodiment of the present invention.

A drive circuit 41 according to a second embodiment of the present invention will be described below with reference to FIG. 3. Differences between the first and second embodiments are as follows. While the drive circuit 1 according to the first embodiment is configured to drive the N-channel power MOSFET 4, the drive circuit 41 according to the second embodiment is configured to drive a P-channel power MOSFET 42. The source of the MOSFET 42 is coupled to the power supply +B, and the drain of the MOSFET 42 is coupled to an electrical load (not shown) such as a electrical motor. The MOSFET 5 of the drive circuit 1 is eliminated from the drive circuit 41. An input terminal 43 for receiving a control signal is coupled via a buffer 44 to the gate of the MOSFET 2.

In a clamp control circuit 45 replacing the clamp control circuit 18 of the drive circuit 1, the output of the AND gate 12 is coupled via the NOT gate 17 to the switch circuit 15 and coupled directly to the switch circuit 16. Further, one side of the switch circuit 15 is coupled to the power supply +B, and one side of the switch circuit 16 is coupled to a negative terminal of the reference voltage VC. A positive terminal of the reference voltage VC is coupled to the power supply +B. The node between the switch circuits 15, 16 is coupled to the gate of a P-channel MOSFET 46 (i.e., clamp transistor) replacing the MOSFET 9 of the drive circuit 1.

An N-channel MOSFET 47 (i.e., mirror transistor) and the MOSFET 3 form a current mirror. The gates of the MOSFETs 3, 47 are coupled together and coupled to the drain of the MOSFET 47. The drains of the MOSFETs 2, 3 are coupled together and coupled to the drain of the MOSFET 47 via the MOSFET 46 and the diode 8. A series circuit of the current source 7 and the switch circuit 6 is coupled between the power supply +B and the drain of the MOSFET 47.

Figure 4A:
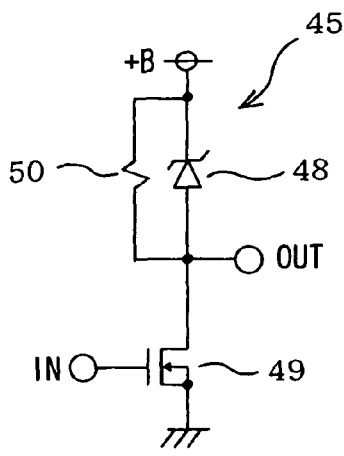
FIG. 4A is a diagram illustrating a concrete example of a clamp circuit in the drive circuit of FIG. 3.

One concrete example of the clamp control circuit 45 is illustrated in FIG. 4A. As shown in FIG. 4A, a series circuit of a Zener diode 48 and an N-channel MOSFET 49 is coupled between the power supply +B and the ground. A node between the Zener diode 48 and the MOSFET 49 is configured as an output terminal coupled to the gate of the MOSFET 42. The gate of the MOSFET 49 is configured as an input terminal for receiving the control signal. A resistor 50 is coupled in parallel with the Zener diode 48.

In the case of the structure shown in FIG. 4A, when the control signal inputted to the gate of the MOSFET 49 is low, the MOSFET 49 is OFF. As a result, an output signal outputted to the gate of the MOSFET 42 becomes high (i.e., power supply +B). In contrast, when the control signal inputted to the gate of the MOSFET 49 is high, the MOSFET 49 is ON. As a result, the output signal outputted to the gate of the MOSFET 42 becomes a level (i.e., +B−VC) obtained by subtracting a Zener voltage VC of the Zener diode 48 from the power supply +B.

Figure 4B:
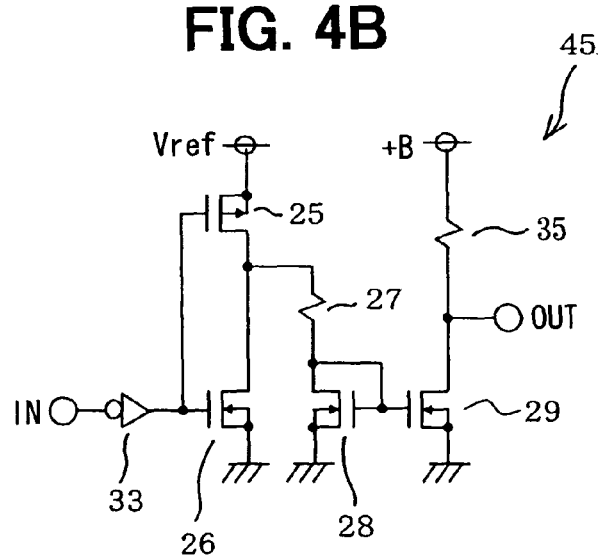
FIG. 4B is a diagram illustrating another concrete example of a clamp circuit in the drive circuit of FIG. 3.

Another concrete example of the clamp control circuit 45 is illustrated in FIG. 4B. As can be seen by comparing FIGS. 2B, 4B, the MOSFETs 30, 32 and the resistor 31 of the clamp control circuit 18 shown in FIG. 2B are eliminated from the clamp control circuit 45 shown in FIG. 4B. Further, the drain of the MOSFET 29 is coupled via a resistor 35 to the power supply +B and configured as an output terminal coupled to the gate of the MOSFET 42.

In the case of the structure shown in FIG. 4B, when the control signal inputted to the input terminal is high, the MOSFET 25 is ON, and the MOSFET 26 is OFF. Therefore, the MOSFETs 28, 29 are ON. As a result, the output signal outputted to the gate of the MOSFET 42 becomes a level (i.e., +B−VC) obtained by subtracting a voltage drop VC across the resistor 35 from the power supply +B. In contrast, when the control signal inputted to the input terminal is low, the MOSFET 25 is OFF, and the MOSFET 26 is ON. Therefore, the MOSFETs 28, 29 are OFF. As a result, the output signal outputted to the gate of the MOSFET 42 becomes the power supply +B.

An operation of the drive circuit 41 according to the second embodiment is described with reference to FIG. 3.

(1) First Case where a Control Signal is Low

When a control signal supplied to the signal input terminal 43 from outside the drive circuit 41 is low, the MOSFET 2 at the output stage is ON. Since the output signals of the AND gates 12, 13 are low, the switch circuit 6 is OFF, the switch circuit 15 is ON, and the switch circuit 16 is OFF. Therefore, the gate potential of the MOSFET 46 becomes the power supply +B so that the MOSFET 46 is OFF. As a result, the MOSFETs 3, 47 are OFF, and the gate potential of the MOSFET 42 becomes high so that the MOSFET 42 is OFF.

(2) Second Case where a Control Signal is High, and +B≧V1

In the second case, the MOSFET 2 at the output stage is OFF, and the output signal of the comparator 14 is high. Since the output signal of the AND gate 12 is high, the switch circuit 15 is OFF, and the switch circuit 16 is ON. Therefore, the gate potential of the MOSFET 46 becomes a level (i.e., +B−VC) obtained by subtracting the reference voltage VC from the power supply +B, so that the MOSFET 46 is ON. As a result, the MOSFETs 3, 47 are ON, and the gate potential of the MOSFET 42 becomes low so that the MOSFET 42 is ON. In this case, a gate potential VG of the MOSFET 42 is clamped to a level obtained by subtracting the threshold voltage Vth of the MOSFET 46 from the gate potential +B-VC of the MOSFET 46. Therefore, the gate potential VG is given as follows:

$$VG = +B - VC - Vth$$

(3) Third Case where a Control Signal is High, and +B<V1

In the third case, since the output signal of the comparator 14 is low, the output signal of the AND gate 12 is low, and the output signal of the AND gate 13 is high. Therefore, the switch circuit 15 is ON, and the switch circuit 16 is OFF. As a result, the MOSFET 46 is OFF. Since the switch circuit 6 is ON, the MOSFETs 3, 47 are driven by the constant current source 7 and turned on. In this case, the gate potential VG of the MOSFET 42 becomes equal to the drain potential of the MOSFET 2. Thus, the voltage clamp function achieved through the MOSFET 46 is not performed.

As described above, the drive circuit 41 according to the second embodiment can drive the P-channel power MOSFET 42 in the same manner as the drive circuit 1 according to the first embodiment drives the N-channel power MOSFET 4.

Third Embodiment

Figure 5:
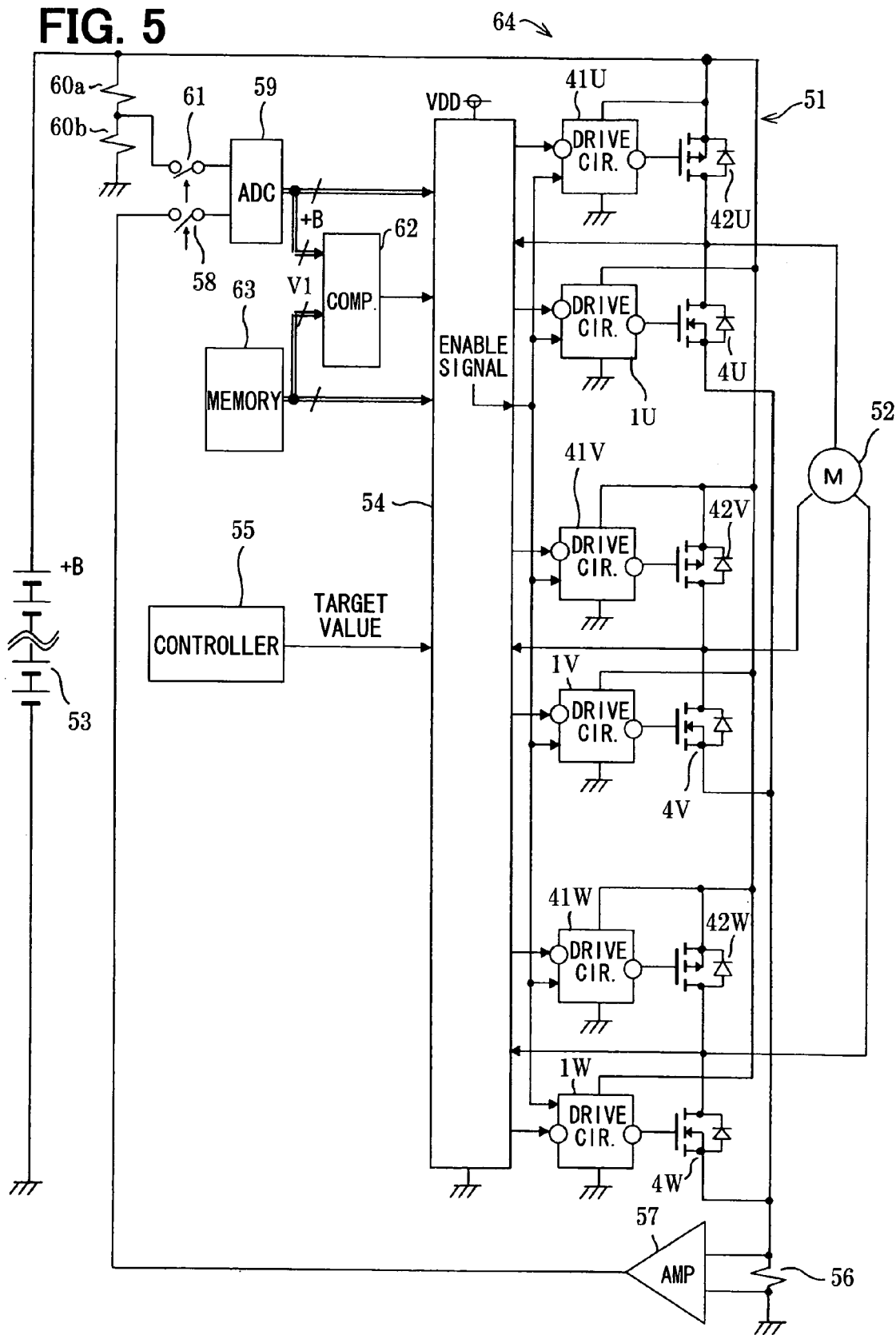
FIG. 5 is a diagram illustrating a motor drive system according to a third embodiment of the present invention.
Figure 6:
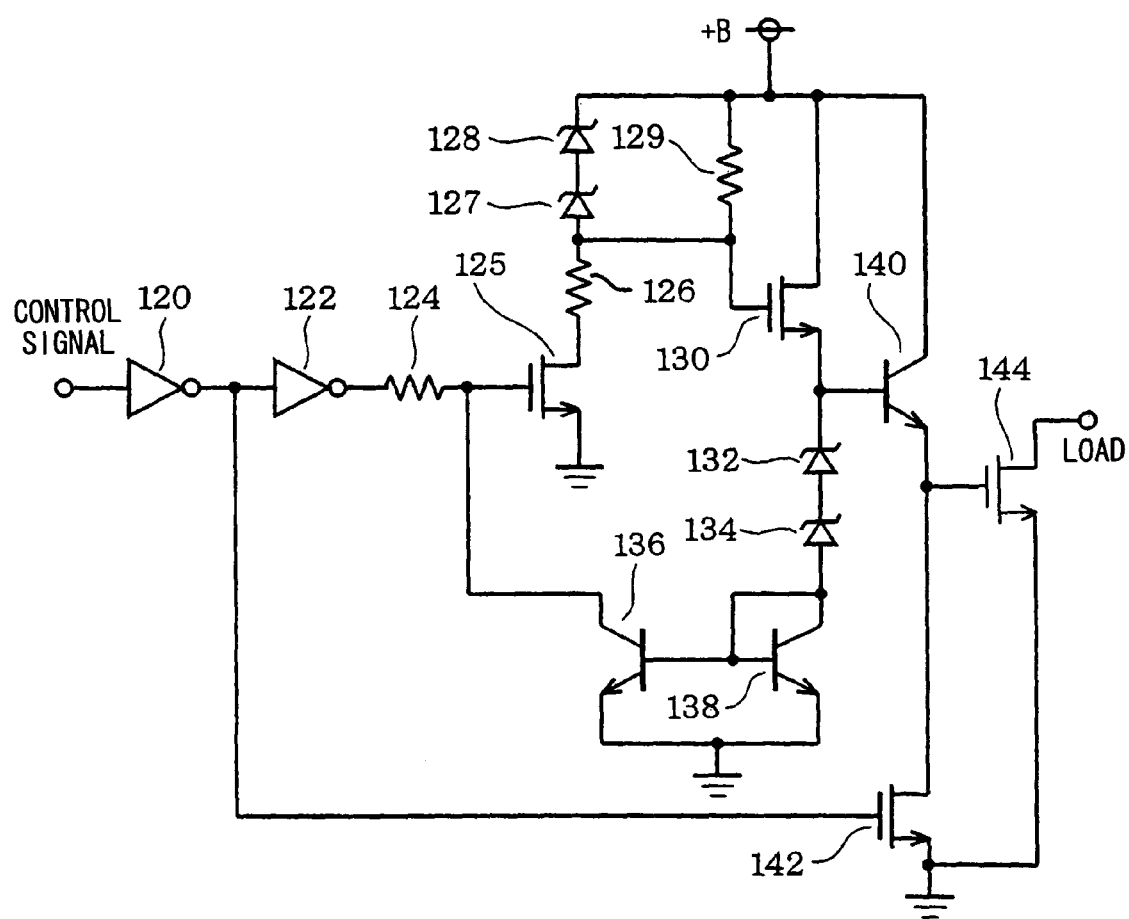
FIG. 6 is a diagram illustrating a conventional semiconductor element drive circuit.

A motor drive system 64 according to a third embodiment of the present invention will be described below with reference to FIG. 5. The motor drive system 64 uses semiconductor element drive circuits and drives a three-phase brushless DC motor 52 mounted on a vehicle An inverter circuit 51 includes MOSFETs 4U, 4V, 4W, 42U, 42V, and 42W that are connected in a conventional three-phase bridge configuration. The inverter circuit 51 has phase output terminals coupled to respective phase windings of the motor 52. A positive power supply line of the inverter circuit 51 is coupled to a vehicle battery 53 as a power supply +B.

The MOSFETs 4U, 4V, 4W, 42U, 42V, and 42W of the inverter circuit 51 are coupled to drive circuits 1U, 1V, 1W, 41U, 41V, and 41W, respectively. Each of the drive circuits 1U, 1V, and 1W is constructed by eliminating the comparator 14 from the drive circuit 1 of the first embodiment. Each of the drive circuits 41U, 41V, and 41W is constructed by eliminating the comparator 14 from the drive circuit 41 of the second embodiment. A voltage clamp function of each of the drive circuits 1U, 1V, 1W, 41U, 41V, and 41W is enabled/disabled in response to a clamp enable signal received from a motor control circuit 54.

For example, the enable signal is a pulse-width modulation (PWM) signal. The motor control circuit 54 determines a duty ratio of the PWM signal according to a target value of a rotational speed of the motor 52. The motor control circuit 54 receives the target value of the motor speed from a controller 55 such as an electronic control unit (ECU). The motor control circuit 54 uses a position sensorless drive technique. Specifically, the motor control circuit 54 is coupled to the phase output terminals of the inverter circuit 51. The motor control circuit 54 monitors phase voltages of the motor 52 and detects a zero-cross point of an induced voltage on the windings. Thus, the motor control circuit 54 detects a rotor position and determines energization timing for the motor 52. Alternatively, the motor control circuit 54 can detect the rotational speed of the motor 52 based on an interval between the zero-cross points.

A shunt resistor 56 is coupled between a negative power supply line of the inverter circuit 51 and a ground. A voltage drop across the shunt resistor 56 is detected by a differential amplifier 57. An output terminal of the differential amplifier 57 is coupled to a first input terminal of an analog-to-digital converter (ADC) 59 via a switch circuit 58. A series circuit of resistors 60a, 60b is coupled between the positive power supply line and the ground. A node between the resistors 60a, 60b is coupled to a second input terminal of the ADC 59 via a switch circuit 61. The motor control circuit 54 controls ON/OFF operations of the switch circuits 58, 61 so that the voltage drop across the shunt resistor 56 and a divided voltage of the battery 53 are selectively A/D-converted to A/D conversion data by the ADC 59.

The A/D conversion data outputted from the ADC 59 is supplied to the motor control circuit 54 and a first input terminal of a digital comparator 62. A second input terminal of the comparator 62 is coupled to a nonvolatile memory 63 such as a flash read only memory (ROM). The nonvolatile memory 63 stores threshold data for the comparator 62. The threshold data corresponds to the reference voltage V1 applied to the comparator 14 of the first and second embodiments. If the motor control circuit 54 is constructed using a microcomputer, the nonvolatile memory 63 can store a control program for the microcomputer.

When the switch circuit 61 is turned on, the comparator 62 compares the A/D conversion data corresponding to the power supply +B with the threshold data stored in the nonvolatile memory 63. When the A/D conversion data is greater or equal to the threshold data, an output signal of the comparator 62 becomes high.

An operation of the motor drive system 64 is described below. Upon receipt of the target value of the rotational speed of the motor 52 from the controller 55, the motor control circuit 54 supplies a drive signal to the motor 52, thereby driving the motor 52. When the rotational speed of the motor 52 reaches a predetermined value, the motor drive system 64 switches to a sensorless control mode and feedback-controls the rotational speed of the motor 52 to the target value.

Further, the motor control circuit 54 can perform an overcurrent protection action during a period of time when the motor 52 is driven. For example, in the overcurrent protection action, the motor control circuit 54 alternately turns on and off the switch circuits 58, 61 at a constant interval. When the switch circuit 58 is ON, the motor control circuit 54 detects a power supply current. If the detected current exceeds a threshold value, the motor control circuit 54 causes the inverter circuit 51 to stop the motor 52, thereby preventing the overcurrent. In contrast, when the switch circuit 61 is ON, the motor control circuit 54 detects the power supply +B. The motor control circuit 54 controls the rotational speed of the motor 52 according to the detected voltage and monitors whether the power supply +B is within a normal range based on the output signal of the comparator 62. As described previously, the comparator 62 compares the A/D conversion data corresponding to the power supply +B with the threshold data stored in the nonvolatile memory 63 and outputs the high level signal when the A/D conversion data is greater or equal to the threshold data. When the comparator 62 outputs the high level signal, the motor control circuit 54 keeps the clamp enable signal high. When the comparator 62 outputs a low level signal due to a decrease in the power supply +B, the motor control circuit 54 changes the clamp enable signal from high to low. Like the first and second embodiments, the voltage clamp function of each of the drive circuits 1U, 1V, 1W, 41U, 41V, and 41W is disabled in response to the low level clamp enable signal.

A typical motor drive system generally includes an ADC for monitoring a power supply voltage and a power supply current and a nonvolatile memory for storing a control program and a control parameter. In the third embodiment, a comparison circuit used to control the voltage clamp function of the drive circuits 1U, 1V, 1W, 41U, 41V, and 41W is constructed using the ADC 59 and the nonvolatile memory 63 in addition to the comparator 62.

As described above, according to the third embodiment, the gates of the MOSFETs 4U, 4V, 4W, 42U, 42V, and 42W of the inverter circuit 51 are driven by the drive circuits 1U, 1V, 1W, 41U, 41V, and 41W, respectively. The motor drive system 64 includes the motor control circuit 54 as a main circuit and the ADC 59 and the nonvolatile memory 63 as peripheral circuits. The ADC 59 and the nonvolatile memory 63 form a comparison circuit for controlling the voltage clamp function of the drive circuits 1U, 1V, 1W, 41U, 41V, and 41W. Therefore, a threshold for enabling and disabling the voltage clamp function can be flexibly, programmably adjusted according to individual needs by rewriting the threshold data stored in the nonvolatile memory 63.

MODIFICATIONS

The embodiments described above may be modified in various ways. For example, the reference voltage V1 can be adjusted according to individual needs. The MOSFET at the output stage and the MOSFET forming the current mirror can be replaced with a bipolar transistor. The MOSFET at the output stage can be replaced with a laterally diffused metal oxide semiconductor (LDMOS) transistor. In such an approach, a logic control can be easy achieved. The MOSFET 4 can be replaced with an insulated gate bipolar transistor (IGBT). In the third embodiment, the rotor position of the motor 52 can be detected using a position sensor such as a Hall integrated circuit (IC). The motor control circuit 54 can be implemented as hardware logic.

Such changes and modifications are to be understood as being within the scope of the present invention as defined by the appended claims.

What is claimed is:

1. A drive circuit for driving a voltage-driven semiconductor element according to an input signal, the drive circuit comprising:

an output stage including a series circuit of two output transistors, a node between the two output transistors being coupled to a control terminal of the semiconductor element, one of the two output transistors being turned on when the input signal indicates that the semiconductor element is driven;

a clamp circuit configured to clamp a potential of the control terminal of the semiconductor element to a predetermined level enough to drive the semiconductor element when the one of two output transistors is turned on;

a comparison circuit configured to compare a voltage of a power supply of the drive circuit with a threshold value; and a clamp control circuit configured to disable the clamp circuit when the comparison circuit determines that the power supply voltage is less than the threshold value.

2. The drive circuit according to claim 1, further comprising:

a mirror transistor coupled to one of two output transistors in a current mirror configuration, wherein the clamp circuit includes a clamp transistor coupled between the mirror transistor and the control terminal of the semiconductor element, wherein the clamp control circuit includes a series circuit of a constant current source and a switch circuit, the series circuit being coupled between the mirror transistor and the power supply or ground, and wherein the clamp control circuit disables the clamp circuit by turning off the clamp transistor and by turning on the switch circuit.

* * * * *